United States Patent
Hirano et al.

(10) Patent No.: US 7,800,230 B2
(45) Date of Patent: Sep. 21, 2010

(54) SOLDER PREFORM AND ELECTRONIC COMPONENT

(75) Inventors: Naohiko Hirano, Okazaki (JP);
Yoshitsugu Sakamoto, Toyohashi (JP);
Tomomi Okumura, Aichi-ken (JP);
Kaichi Tsuruta, Tochigi-ken (JP);
Minoru Ueshima, Matsudo (JP);
Takashi Ishii, Mouka (JP)

(73) Assignees: DENSO CORPORATION, Kariya (JP);
Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 12/226,764

(22) PCT Filed: Apr. 26, 2007

(86) PCT No.: PCT/JP2007/059052

§ 371 (c)(1),
(2), (4) Date: May 11, 2009

(87) PCT Pub. No.: WO2007/125991

PCT Pub. Date: Nov. 8, 2007

(65) Prior Publication Data

US 2009/0236725 A1    Sep. 24, 2009

(30) Foreign Application Priority Data

Apr. 28, 2006   (JP) ............................. 2006-124891

(51) Int. Cl.
*H01L 23/48* (2006.01)
*H01L 23/52* (2006.01)
*H01L 29/40* (2006.01)

(52) U.S. Cl. ...................................... 257/772; 257/779
(58) Field of Classification Search ................. 257/772, 257/779; 228/56.3
See application file for complete search history.

(56) References Cited

U.S. PATENT DOCUMENTS

| 5,540,379 A | * | 7/1996 | Kazem-Goudarzi et al. ...... 228/248.5 |
| 6,278,184 B1 | * | 8/2001 | Brofman et al. ............. 257/737 |
| 2005/0161489 A1 | * | 7/2005 | Pikulski ..................... 228/56.3 |
| 2010/0068552 A1 | * | 3/2010 | Goerlich et al. ............. 428/615 |

FOREIGN PATENT DOCUMENTS

JP        A-3-281088         12/1991

(Continued)

OTHER PUBLICATIONS

International Search Report mailed on Aug. 7, 2007 for the corresponding International patent application No. PCT/US2007/059052.

*Primary Examiner*—S. V Clark
(74) *Attorney, Agent, or Firm*—Posz Law Group, PLC

(57) ABSTRACT

A solder preform according to the present invention has a variation in the size of high melting point metal particles which is at most 20 micrometers when the metal particle diameter is 50 micrometers, and an alloy layer of the high melting point metal particles and the main component of solder is formed around the high melting point metal particles. In addition, no voids at all are present in the solder. An electronic component according to the present invention has a semiconductor element bonded to a substrate with the above-described solder preform and has excellent resistance to heat cycles.

4 Claims, 4 Drawing Sheets

FOREIGN PATENT DOCUMENTS

| JP | A-6-000685 | 1/1994 |
| JP | A-6-31486 | 2/1994 |
| JP | A-6-232188 | 8/1994 |
| JP | A-6-285686 | 10/1994 |
| JP | A-2005-161338 | 6/2005 |

* cited by examiner

SOLDER PREFORM AND ELECTRONIC COMPONENT

CROSS REFERENCE TO RELATED APPLICATIONS

This application is a U.S. national stage application of PCT/JP2007/059052 filed on Apr. 26, 2007, based on Japanese Patent Application No. 2006-124891 filed on Apr. 28, 2006, the disclosures of which are incorporated herein by reference.

TECHNICAL FIELD

This invention relates to a solder preform for use in die bonding to join a semiconductor element and a substrate. This invention also relates to an electronic component comprising a semiconductor element and a substrate which are bonded to each other using such a solder preform.

BACKGROUND ART

In high performance electronic components such as BGA's (ball grid array packages) and CSP's (chip size packages), a semiconductor element and a substrate are bonded to each other by die bonding using a bonding material. Die bonding refers to a process in which a semiconductor element obtained by cutting of a silicon wafer is secured to a support substrate therefor. Die bonding of a semiconductor element and a substrate is carried out so that when the semiconductor element generates heat during use of electronic equipment, the semiconductor itself is prevented from undergoing a decrease in performance or thermal damage under the influence of heat. Namely, as a result of die bonding of a semiconductor element and a substrate, the semiconductor element and the substrate are intimately contacted with each other, and heat generated from the semiconductor element is dissipated through the substrate. Die bonding is also carried out in order to electrically ground a semiconductor element.

Adhesive resins and solder are generally used as materials for die bonding. If the objective of die bonding is dissipation of heat from a semiconductor element, an adhesive resin is satisfactory, but when heat dissipation and electrical grounding are the objectives, it is preferable to use solder, which has good thermal conductivity and good electrical conductivity.

In die bonding of a semiconductor element and a substrate, when a solder preform is placed on a substrate and heated so that the solder preform melts, the resulting molten solder is pressed out from between portions to be soldered under the weight of the semiconductor element, and the amount of solder between portions to be soldered sometimes becomes small. Bonding by means of solder requires a suitable amount of solder between portions to be soldered in order to exhibit the inherent bonding strength of solder. However, if as described above solder between portions to be soldered is forced out by the weight of a semiconductor element placed atop the solder, the clearance between the semiconductor element and the substrate becomes too small, and an adequate amount of solder cannot be present, resulting in a decrease in bonding strength. Namely, a maximum bonding strength can be exhibited in soldering if the clearance is suitable, but the bonding strength of the joint as a whole becomes weak if portions having a small clearance are locally formed.

In order to perform soldering such that portions to be soldered are suitably separated and a suitable amount of solder is maintained between the portions to be soldered, a plurality of high melting point metal particles having a melting point higher than solder (referred to below simply as metal particles) such as metal particles of Ni, Cu, Ag, Fe, Mo, or W have been interposed between the portions to be soldered. However, placing metal particles between portions to be soldered each time soldering is carried out is extremely troublesome and results in poor production efficiency, so solder preforms having metal particles previously interspersed therein have been used.

Patent Document 1 discloses a roller embedding method in which metal particles are dispersed atop a solder sheet using a hopper, and the metal particles are embedded in the solder sheet using an embedding roller. As the metal particles, round, triangular, cylindrical, or plate-shaped particles, minute particles, or the like are used.

Patent Document 2 also discloses a roller embedding method. The resulting solder preform has metal particles with a particle diameter of 30-70 micrometers embedded in solder.

Patent Document 3 discloses a method of producing a composite solder ingot having metal particles dispersed therein. In that method, a mixture of metal particles and a flux which have been kneaded together is charged into molten solder and stirred, cooled, and solidified. The particle diameter of the metal particles used in this case is 20 micrometers, 50 micrometers, or 100 micrometers.

Patent Document 4 discloses a method of producing a solder preform in which superimposed sheets having metal particles dispersed from a hopper between two solder sheets are subjected to rolling such that the two sheets are adhered to each other. That method uses metal particles having an average particle diameter of 30-300 micrometers, with the standard deviation of the particle diameter being at most 2.0 micrometers.

Patent Document 1: JP H03-281088 A
Patent Document 2: JP H06-685 A
Patent Document 3: JP H06-31486 A
Patent Document 4: JP 2005-161338 A

DISCLOSURE OF INVENTION

In an electronic component comprising a semiconductor element and a substrate which were soldered using a conventional preform solder, the semiconductor element was sometimes bonded to the substrate in a sloping state or such that the soldered portion could easily peel off if a slight impact was applied to the soldered portion.

In the solder preform disclosed in Patent Document 1, metal particles which are round, triangular, plate-shaped, cylindrical, and the like are dispersed atop a solder sheet, and an embedding roller is applied from above to embed the metal particles in the solder sheet.

FIG. 3 is a schematic cross-sectional view of a solder preform of Patent Document 1, and FIG. 4 is an enlarged schematic view of a portion of an electronic component comprising a semiconductor element and a substrate die bonded using this solder preform.

As shown in FIG. 3, the size of the metal particles is not fixed in the solder preform 30 of Patent Document 1. Therefore, when the solder preform is used to bond a semiconductor element 31 and a substrate 32 to form an electronic component 33 (FIG. 4), the bonded semiconductor element 31 becomes low where there are small metal particles (the triangular particles in the figure) and becomes high where there are large metal particles (the large round or rectangular particles in the figure). In addition, if the solder preform of Patent Document 1 is observed on a microscopic level, the metal particles 34 and the solder sheet 35 are in mere contact with each other, namely, air 36 is present in the periphery of the metal particles 34.

If a semiconductor element and a substrate are soldered using a solder preform in which air is present around metal particles as mentioned above, the air which is present around the metal particles expands in volume as it increases in temperature, and it sometimes forms large voids 37 as shown in FIG. 4 and causes the semiconductor element to lean. In addition, the bonding strength becomes weak if the metal particles are not metallically bonded to solder.

The solder preforms of Patent Documents 2 and 4 are prepared by interposing metal particles between two solder sheets and adhering the two solder sheets to each other by pressing with a roller. Accordingly, as shown in FIG. 5, metal particles 41 and solder 42 are merely touching in the solder preforms 40 of Patent Documents 2 and 4 as well, and if the preforms are viewed microscopically, air 43 is present in the periphery of the metal particles 41. If such a solder preform is placed between a semiconductor element 44 and a substrate 45 and heated to melt the solder preform and form an electronic component 46, as shown in FIG. 6, the slight amount of air which is present around the metal particles expands in volume as its temperature increases and becomes large voids 47. These large voids may lift up the semiconductor element 44 and cause it to slope.

Thus, in the case of Patent Documents 2 and 4, as is the case with Patent Document 1, metal particles and solder are not metallically bonded to each other, so the bonding strength is low.

With a solder preform obtained by the method of Patent Document 3, a mixture of metal particles and flux is charged into molten solder, so the metal particles are metallically bonded to the molten metal, and there are fewer voids than in a solder preform produced by a method using rollers. However, even with a solder preform produced by the method of Patent Document 3, voids sometimes developed thereby causing a semiconductor element to lean or the bonding strength to decrease. The cause of this phenomenon is thought to be the presence of flux adhering to the periphery of metal particles.

FIG. 7 is a schematic cross-sectional view of a solder preform of Patent Document 3, and FIG. 8 is an enlarged schematic view of a portion of an electronic component comprising the semiconductor element and a substrate which are die bonded using this solder preform.

As shown in FIG. 7, with the solder preform 50 of Patent Document 3, minute masses of solid or liquid flux 52 remain to adhere to metal particles 51. When this solder preform is interposed between a semiconductor element 53 and a substrate 54 and heated and melted to obtain an electronic component 55, the minute masses of flux vaporize and expand in volume as the temperature increases and form large voids 56 as shown in FIG. 8. The large voids may lift up the semiconductor element 53. The soldered portion is then cooled in order to solidify the solder. Because the solder is rapidly hardened, the voids maintain a large volume without becoming smaller. Accordingly, the height of the semiconductor element increases in a portion where a large void is formed thereby causing the semiconductor element to lean.

Thus, with the solder preform of Patent Document 3 as well, although metal particles and solder are metallically bonded to each other, the bonding area is decreased due to the formation of voids, leading to weakening in the bonding strength.

When a semiconductor element and a substrate is soldered using a conventional solder preform, the reasons why peeling readily occurs when just a small impact is applied to soldered portions reside in that the metal particles contained in the solder preform are not metallically bonded to the solder in the preform and the formation of voids around the metal particles. The fact that the metal particles and solder are not metallically bonded to each other weakens the bonding strength around the metal particles. The presence of even a small amount of air or flux around the metal particles causes the formation of large voids at the time of heating thereby decreasing the bonding area. In recent years, semiconductor elements are becoming smaller in size and the soldered area thereof is also becoming smaller. Therefore, when voids develop, the proportion occupied by voids with respect to the small soldered area increases, so the soldered area decreases and the bonding strength decreases.

The present inventors found that if the variation in the particle diameter of metal particles is within a certain range, leaning decreases, and if the periphery of the metal particles have an alloy layer with solder, the bonding strength between the metal particles and solder increases, thereby providing a solder preform which can exhibit excellent performance in die bonding. As a result, they completed the present invention.

The present invention is a solder preform having high melting point particles with an average particle diameter of 20-300 micrometers dispersed in a solder sheet, characterized in that the variation in the particle diameter of the high melting point metal particles is at most 20 micrometers and that a layer of an alloy of a main component of the solder and the metal of the high melting point metal particles is formed around the high melting point metal particles.

In another aspect, the present invention is an electronic component characterized in that a semiconductor element and a substrate are soldered using a solder preform having high melting point metal particles with an average particle diameter of 20-300 micrometers dispersed in a solder sheet, wherein the high melting point metal particles dispersed in the solder sheet have a variation in particle diameter of at most 20 micrometers and have an alloy layer formed around the high melting point metal particles, the alloy layer being an alloy of the metal of the particles with the solder of the sheet.

In the present invention, high melting point metal particles with an average particle diameter of 20-300 micrometers are used because a gap of around 20-300 micrometers is necessary between a semiconductor element and a substrate. The average particle diameter can be selected within this range taking the necessary gap into consideration.

In the case in which the average particle diameter of the metal particles is 50 micrometers, if the variation of the metal particles is larger than 40% of this particle diameter, i.e., if the variation is larger than 20 micrometers, even if voids do not develop, sloping of the semiconductor element with respect to the substrate increases after soldering such that the bonding strength becomes weak in portions where the clearance becomes narrow. By the formation of an alloy layer around the metal particles, the metal particles and the solder are completely metallically bonded to each other. As a result, not only does the bonding strength between the metal particles and solder increase, but the formation of voids decreases.

The range for the variation in particle diameter is up to 40% and preferably up to 20% of the particle diameter of the metal particles.

In a solder preform according to the present invention, there is no envelopment or retention of air or flux in the bonded interface between high melting point metal particles and solder, so there are no voids at all in the interface after soldering is carried out.

In a solder preform according to the present invention, metal particles dispersed in solder must have an alloy layer of an alloy with the solder formed around the metal particles. The solder may be any type used in the manufacture of typical electronic components, but an Sn-based lead-free solder is suitable from the standpoint of recent regulations on the use of Pb.

Metal particles which are dispersed in solder are preferably any of Ni, Ag, Cu, and Fe which easily alloy with Sn, which is the main component of lead-free solder. An alloy layer which is formed around metal particles is an intermetallic compound of Sn and the metal constituting the metal particles. For example, if the metal particles are Ni and the solder is an Sn-based lead-free solder, intermetallic compounds of Ni and Sn such as $Ni_3Sn$, $Ni_3Sn_2$, and $Ni_3Sn_4$ are formed on the surface of the metal particles. If the metal particles are Cu and the solder is an Sn-based lead-free solder, intermetallic compounds such as $Cu_3Sn$ or $Cu_6Sn_5$ are formed on the surface of the metal particles.

Each of these metals has a high melting point of at least 1000° C. and does not melt at usual soldering temperatures. In other words, a metal (which may be an alloy) which constitutes metal particles used in the present invention is a metal in the form of particles which forms an alloy layer (an intermetallic compound) with the main component of the solder alloy used in the solder preform and has a melting temperature at least 300° C. higher than the melting point of the solder alloy.

When a semiconductor element and a substrate are soldered using a solder preform according to the present invention, an excellent soldered portion can be obtained since bonding takes place without the semiconductor element sloping with respect to the substrate, thereby causing no decrease in bonding strength due to an insufficient amount of solder and since the bonding strength between metal particles and solder is increased due to an alloy layer formed around metal particles from an alloy with the solder.

An electronic component according to the present invention does not have voids in soldered portions between a semiconductor element and a substrate, and the bonding strength between the semiconductor element and the substrate is strong. Therefore, the electronic component has reliability lacking in a conventional electronic component in that peeling does not readily take place if an external impact is applied to it.

An electronic component according to the present invention is an electronic component obtained by die bonding. Specifically, it refers to a semiconductor device having a semiconductor element die bonded atop a substrate, for example, a so-called die pad, and it may exemplified by an electronic component which is used in the form of a BGA, a CSP, or the like.

BEST MODE FOR CARRYING OUT THE INVENTION

A solder preform according to the present invention will be explained based on the drawings.

Figure 1:
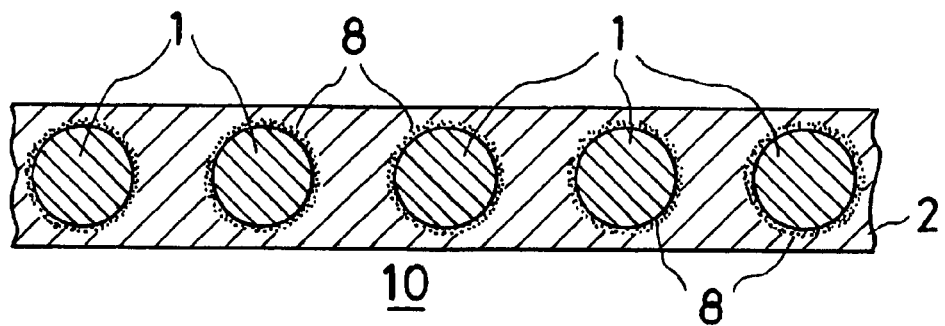
FIG. 1 is a schematic cross-sectional view of a solder preform according to the present invention.
Figure 2:
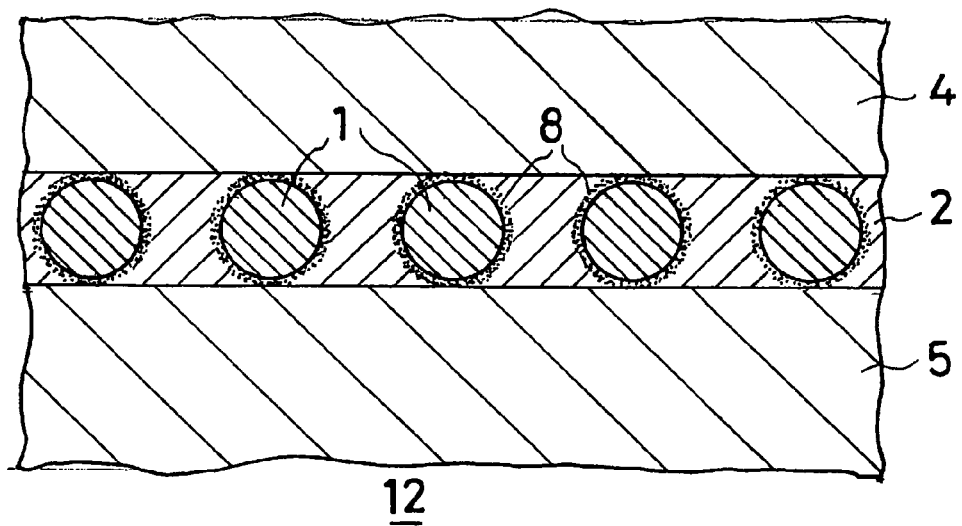
FIG. 2 is a partial schematic cross-sectional view of an electronic component according to the present invention.
Figure 3:
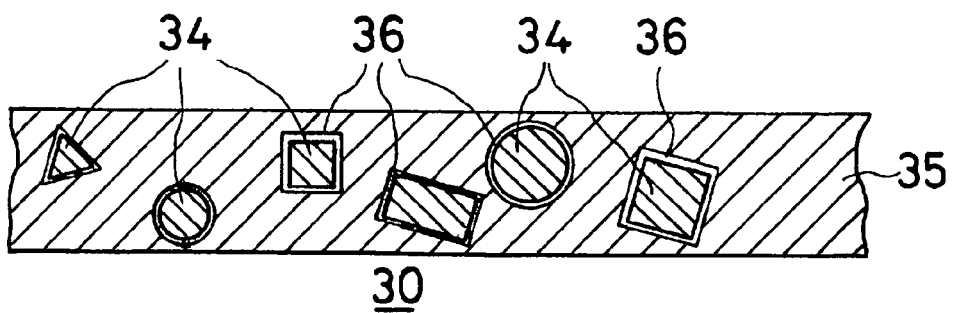
FIG. 3 is a schematic cross-sectional view of a conventional solder preform.
Figure 4:
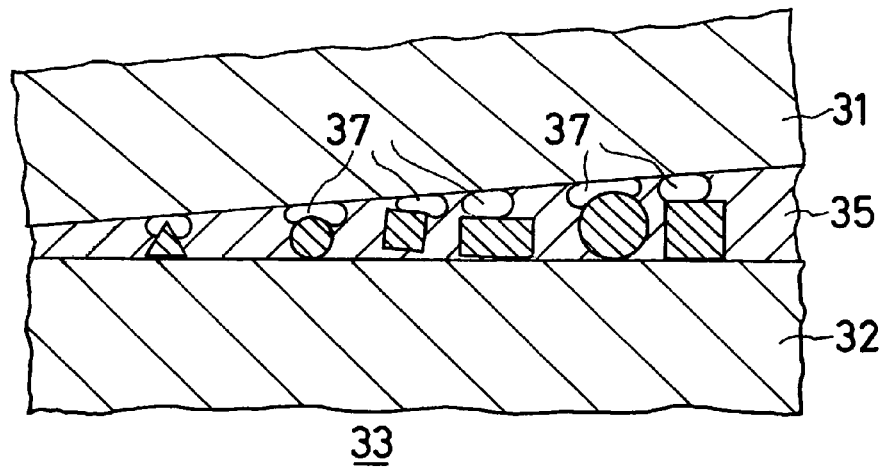
FIG. 4 is a partial schematic cross-sectional view of a conventional electronic component.
Figure 5:
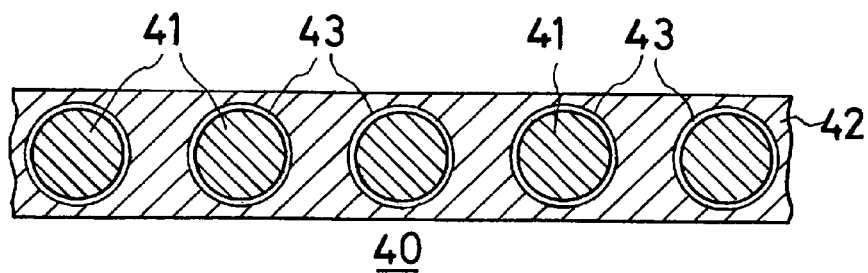
FIG. 5 is a schematic cross-sectional view of a conventional solder preform.
Figure 6:
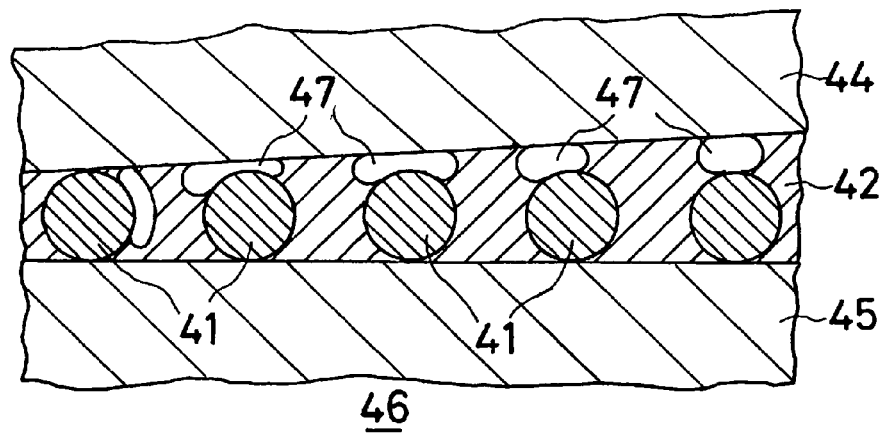
FIG. 6 is a partial schematic cross-sectional view of a conventional electronic component.
Figure 7:
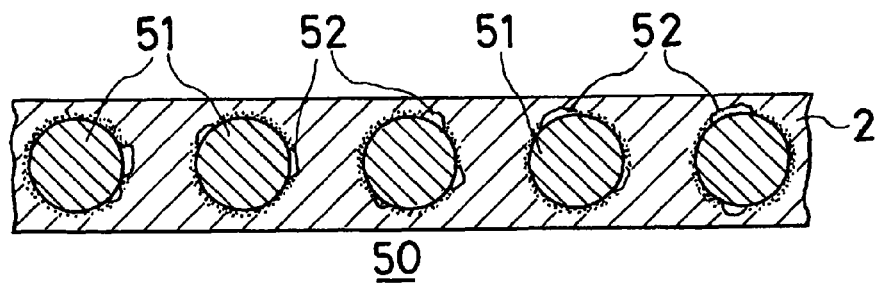
FIG. 7 is a schematic cross-sectional view of a conventional solder preform.
Figure 8:
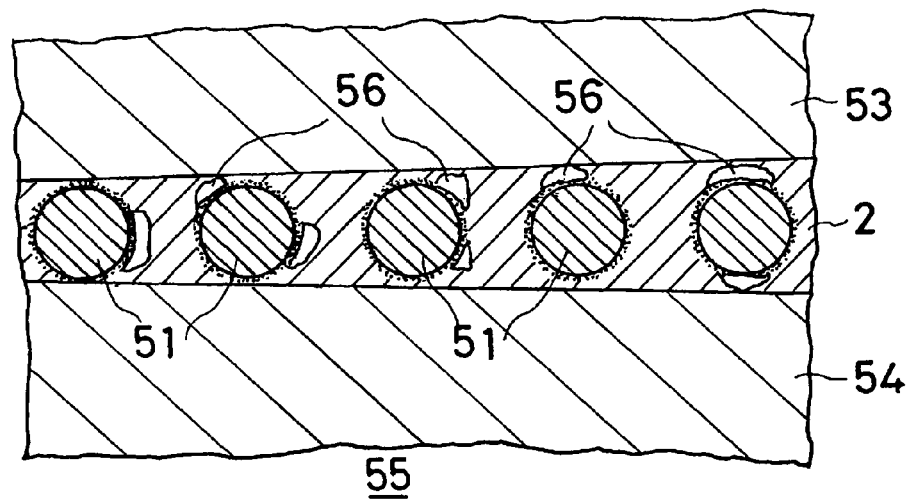
FIG. 8 is a partial schematic cross-sectional view of a conventional electronic component.

FIG. 1 is a schematic cross-sectional view of a solder preform according to the present invention, and FIG. 2 is a schematic cross-sectional view of a portion of an electronic component comprising a semiconductor element and a substrate which are soldered using a solder preform according to the present invention.

As shown in FIG. 1, a solder preform 10 according to the present invention has metal particles 1 dispersed in solder 2 in the form of a sheet. The metal particles 1 are metallically bonded to the solder 2, and an alloy layer 8 is formed on the periphery of each metal particle 1. Flux or air is not present around the metal particles 1.

As shown in FIG. 2, in an electronic component 12 which is prepared by placing the solder preform 10 between a semiconductor element 4 and a substrate 5 followed by heating to melt the solder preform, the semiconductor element 4 is bonded to the substrate 5 in parallel therewith, and there are no voids whatsoever around the metal particles 1 dispersed in the solder 2.

A method of manufacturing a solder preform according to the present invention will next be explained using the mixed mother alloy method as an example.

First, metal particles in a proportion higher than the proportion which is actually to be dispersed in solder are mixed with a thermally decomposable liquid flux to obtain a mixture. The resulting mixture is charged into molten solder, and after stirring, the melt is rapidly cooled to form a mixed mother alloy. A predetermined amount of the mixed mother alloy which is measured is charged into molten solder, and after stirring, the melt is cast into a mold and rapidly cooled to obtain a billet. The billet is then extruded through an extruder to obtain a strip, and the resulting strip is rolled in a rolling mill to obtain a ribbon. The ribbon is then punched to a predetermined shape to obtain a solder preform having a large number of metal particles dispersed in a solder sheet.

In a solder preform obtained by the above-described mixed mother alloy method, metal particles are mixed with a thermally decomposable flux and then charged into molten solder. Therefore, the flux vaporizes in the molten solder and does not readily remain in the solder. Even if a small amount of flux remains in the mixed mother alloy, the mixed mother alloy is charged into molten solder, in which the flux is completely vaporized and disappears. Furthermore, in the above-described method, metal particles and solder are metallically bonded to each other at the time of preparing the mixed mother alloy, and the surface of the metal particles is completely wet by molten solder at this time. When the mixed mother alloy is then charged into molten solder, an alloy layer formed in the portions of the metal particles which is wet by molten solder grows so as to form an intermetallic compound.

A flux used in the above-described mixed mother alloy method comprises a rosin, an activator, and a solvent. Examples of a rosin include a hydrogenated rosin, a phenol-modified rosin ester, and a polymerized rosin. Examples of an activator include adipic acid, succinic acid, maleic acid, benzoic acid, and diethylaniline HBr. Examples of a solvent include ethylene glycol monomethyl ether, ethylene glycol monoethyl ether, ethylene glycol monobutyl ether, diethylene glycol monomethyl ether, diethylene glycol monoethyl ether, and 2-propanol.

The rosin and the activator of the above-described flux decompose or float on the surface of the solder bath and separate from solder at 285° C., which is the temperature at which metal particles are dispersed in a Sn—Cu—Ni—P lead-free solder (melting temperature of approximately 230° C.) containing 99 mass % of Sn to which minute amounts of Cu, Ni, and P are added. Therefore, none of the rosin or the activator remains in the solder. The solvent has a boiling point of at most 230° C., so it is completely vaporized at the melting temperature of this lead-free solder and does not remain in the solder. One example of a suitable composition of the flux is as follows.

60.0 mass % of a rosin (hydrogenated rosin);
10.0 mass % of an activator (diethylaniline HBr); and
30.0 mass % of a solvent (ethylene glycol monoethyl ether).

When the mixed mother alloy is charged into a large amount of molten solder, due to the metal particles in the mother alloy which are already metallically bonded to the solder in the alloy, the charged mixed mother alloy is dispersed in the large amount of molten solder in a short length of time. At this time, the flux even if remaining in the mixed mother alloy is completely removed by the second melting and stirring. The molten solder having metal particles uniformly dispersed therein is then poured into a mold for a billet, and a billet having metal particles uniformly dispersed therein is obtained by rapidly cooling the mold.

The mixture used when preparing a mixed mother alloy contains a thermally decomposable flux, so when the mixture is charged into molten solder, almost all of the flux is decomposed and vaporized. Therefore, even if a minute amount of flux remains in the mixed mother alloy, when the mixed mother alloy is charged into molten solder in a subsequent step, the flux is completely decomposed and none of it remains in the solder. If it is desired to completely remove flux from solder with certainty, the molten solder may be subjected to vacuum treatment in a vacuum apparatus when preparing the mixed mother alloy or when preparing the billet.

High melting point metal particles which are dispersed in a solder preform according to the present invention must have a melting point higher than the solder used in the solder preform, and they must be easily wet by molten solder. Metal particles which can be used in the present invention include particles of Ni, Cu, Ag, Fe, Mo, and W, but Ni particles are preferred for use in the present invention. Ni particles are not readily eroded by molten solder, they are inexpensive, and they are generally commercially available in the form of minute balls and so are easy to obtain. Of course, alloys of these metals may be used.

If the clearance between a semiconductor element and a substrate becomes smaller than 20 micrometers, the amount of solder between them becomes small and the inherent bonding strength of solder can no longer be exhibited. Therefore, the diameter of metal particles is at least 20 micrometers. Preferably it is 40-300 micrometers.

In general, the thickness of a solder preform is close to the desired clearance. Accordingly, metal particles used in the solder preform have a diameter close to this clearance. However, if the diameter of the metal particles is the same as the thickness of the solder preform, the metal particles are exposed on the surface of the solder preform at the time of forming the solder preform and solder does not adhere to the exposed portions. As a result, at the time of soldering to manufacture an electronic component, the portions where the metal particles are exposed are not metallically bonded to the component. In the case of a thick solder preform, the diameter of the metal particles is made at most 90% of the thickness of the solder preform in order to leave room to cover the upper and lower portions of the metal particles with solder.

A solder preform according to the present invention can have any alloy composition, but a lead-free solder is preferred in light of recent regulations on the use of Pb. Lead-free solders have Sn as the main component to which metals selected from Ag, Cu, Sb, Bi, In, Zn, Ni, Cr, Mo, Fe, Ge, Ga, P, and the like are suitably added. As Sn tends to easily erodes metal particles, Ni is preferably previously added to the lead-free solder when using Ni particles.

Namely, in the case of using Ni particles as high melting point metal particles, if Ni is contained in the lead-free solder, the Ni particles are not readily eroded by the molten lead-free solder when they are brought into contact with the molten lead-free solder. Examples of Ni-containing lead-free solders include Sn—Cu—Ni—P alloys, Sn—Ag—Ni alloys, Sn—Cu—Ni alloys, Sn—Ag—Cu—Ni alloys, Sn—Zn—Ni alloys, Sn—Sb—Ni alloys, Sn—Bi—Ni alloys, Sn—In—Ni alloys, and the like.

A ribbon can be processed by punching with a press, for example, to obtain so-called solder preforms of various shapes, such as pellets or washers.

Next, examples of the present invention and comparative examples will be explained.

Example 1

Solder preform: 10×10×0.1 (mm);
Method of manufacturing solder preform: mixed mother alloy method;
Metal particles: Ni (diameter of 50 micrometers, variation of at most 10 micrometers);
Solder: Sn-0.7Cu-0.06Ni-0.005P;
Intermetallic compounds formed on the periphery of metal particles: $Ni_3Sn$, $Ni_3Sn_2$, $Ni_3Sn_4$;
Soldering method: A semiconductor element measuring 10×10×0.3 (mm) was die bonded to a substrate (nickel-plated copper substrate) measuring 30×30×0.3 (mm) using the solder preform. Namely, the solder preform was interposed between the semiconductor element and the substrate, and reflow was carried out in a nitrogen-hydrogen mixed gas atmosphere having an oxygen concentration of 10 ppm for three minutes at a temperature of at least 235° C. with a peak temperature of 280° C. and a total reflow time of 15 minutes.

Example 2

Solder preform: 10×10×0.1 (mm);
Method of manufacturing solder preform: mixed mother alloy method;
Metal particles: Cu (diameter of 50 micrometers, variation of at most 10 micrometers);
Solder: Sn-3Ag-0.5Cu;
Intermetallic compounds formed on the periphery of metal particles: $Cu_3Sn$, $Cu_6Sn_5$;
Soldering method: Same as in Example 1.

Comparative Example 1

Solder preform: 10×10×0.1 (mm);

Method of manufacturing solder preform: roller embedding method;

Metal particles: Ni (diameter of 50 micrometers, variation of at least 30 micrometers);

Solder: Sn-0.7Cu-0.6Ni-0.05P;

Intermetallic compounds formed on the periphery of metal particles: None;

Soldering method: Same as in Example 1.

When the bonded portions of electronic components prepared using the solder preforms of Examples 1 and 2 and Comparative Example 1 were observed with a transmission x-ray apparatus for the presence of voids, there were no voids in the electronic components prepared from the solder preforms of Examples 1 and 2, but voids developed in the electronic components prepared from the solder preform of Comparative Example 1. From this result, it can be seen that envelopment of air or presence of flux residue was not observed in a solder preform according to the present invention.

When the thickness of the periphery of each of electronic components prepared using the solder preforms of Examples 1 and 2 and Comparative Example 1 was measured with a micrometer, the difference between the maximum thickness and the minimum thickness for Examples 1 and 2 was at most 20 micrometers, while the difference between the maximum thickness and the minimum thickness for Comparative Example 1 was 60 micrometers.

Electronic components prepared using the solder preforms of Example 1 and Comparative Example 1 were subjected to a heat cycle test from −30° C. to +120° C. in accordance with the standard JASO D001-87 specified by the Society of Automotive Engineers of Japan.

Figure 9:
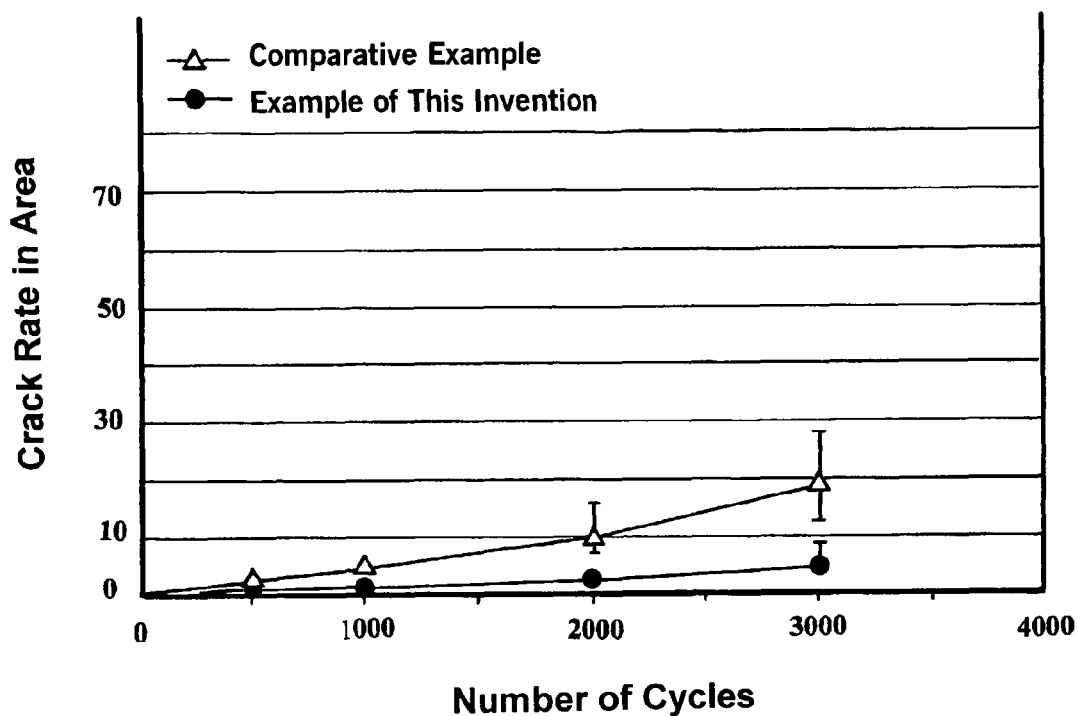
FIG. 9 is a graph showing the results of a heat cycle test of an example and a comparative example.

FIG. 9 is a graph showing the results of this test. With the results of the example, cracks did not develop even after 500 cycles, but for the comparative example, cracks developed by 500 cycles. With respect to the target at 3,000 cycles in the standard (a crack rate of at most 20%), the crack rate was at most 10% for the example and its deviation was small. In contrast, for the comparative example, the crack rate was 12-28%, so the deviation was large and the target was not achieved.

The invention claimed is:

1. A solder preform having high melting point metal particles dispersed in a solder sheet of a solder alloy, characterized in that the metal particles have a melting point at least 300° C. higher than the melting point of the solder alloy and have a particle diameter of 20-300 micrometers with the variation in the particle diameter of the high melting point metal particles being at most 40% of the particle diameter, the high melting point metal particles having an alloy layer formed from the main component of the solder and the high melting point metal particles on the periphery of the metal particles.

2. A solder preform as set forth in claim 1 characterized in that the high melting point metal particles are made of at least one selected from Ni, Ag, Cu, Fe, and alloys thereof, the solder is a lead-free solder having Sn as a main component, and the alloy layer formed on the periphery of the high melting point metal particles is an intermetallic compound of Sn and the metal of the high melting point metal particles.

3. An electronic component characterized by comprising a semiconductor element and a substrate and having a solder joint which is formed by soldering using the solder preform of claim 1, wherein the soldered joint is free from voids formed therein and the difference between the maximum thickness and the minimum thickness of the soldered joint is at most 40% of the diameter of the metal particle.

4. An electronic component characterized by comprising a semiconductor element and a substrate and having a solder joint which is formed by soldering using the solder preform of claim 2, wherein the soldered joint is free from voids formed therein and the difference between the maximum thickness and the minimum thickness of the soldered joint is at most 40% of the diameter of the metal particle.

\* \* \* \* \*